(12) United States Patent
Van Bommel et al.

(10) Patent No.: US 11,293,597 B2
(45) Date of Patent: Apr. 5, 2022

(54) LED FILAMENT LAMP COMPRISING A CONTROL UNIT

(71) Applicant: SIGNIFY HOLDING B.V., Eindhoven (NL)

(72) Inventors: Ties Van Bommel, Horst (NL); Robert Jacob Pet, Waalre (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 33 days.

(21) Appl. No.: 16/975,371

(22) PCT Filed: Feb. 19, 2019

(86) PCT No.: PCT/EP2019/054046
§ 371 (c)(1),
(2) Date: Aug. 24, 2020

(87) PCT Pub. No.: WO2019/166273
PCT Pub. Date: Sep. 6, 2019

(65) Prior Publication Data
US 2021/0033247 A1 Feb. 4, 2021

(30) Foreign Application Priority Data
Feb. 27, 2018 (EP) .................................... 18158870

(51) Int. Cl.
*F21K 9/232* (2016.01)
*H05B 45/3577* (2020.01)
(Continued)

(52) U.S. Cl.
CPC ............. *F21K 9/232* (2016.08); *H05B 45/18* (2020.01); *H05B 45/20* (2020.01);
(Continued)

(58) Field of Classification Search
CPC ......... F21K 9/232; H05B 45/18; H05B 45/20; H05B 45/3577; F21Y 2113/10; F21Y 2115/10; F21Y 2107/00; H01L 25/0753
See application file for complete search history.

(56) References Cited

U.S. PATENT DOCUMENTS

| 9,420,644 | B1 | 8/2016 | Shum |
| 2008/0137360 | A1* | 6/2008 | Van Jijswick ......... F21K 9/232 362/555 |

(Continued)

FOREIGN PATENT DOCUMENTS

| CN | 205208156 U | 5/2016 |
| CN | 205746175 U | 11/2016 |
| WO | 2016145450 A1 | 9/2016 |

*Primary Examiner* — Evan P Dzierzynski
(74) *Attorney, Agent, or Firm* — Daniel J. Piotrowski

(57) ABSTRACT

A light emitting diode, LED, filament lamp (100), comprising a light emitting diode light source (110), comprising at least one first filament (120*a*), arranged to emit light having a first color temperature, at least one second filament (120*b*), arranged to emit light having a second color temperature, different from the first color temperature, wherein each of the first and second filaments comprises a substrate (130*a*, 130*b*) of elongated shape, wherein at least one light emitting diode (140*a*, 140*b*) is arranged on the substrate. The LED filament lamp further comprises a control unit (150) configured to control a first intensity of the light emitted from the first filament(s) and to control a second intensity of the light emitted from the second filament(s) according to at least one predetermined setting, in order to control the total color temperature of the light emitted from the LED filament lamp as a function of the predetermined setting(s).

14 Claims, 4 Drawing Sheets

(51) Int. Cl.
*H05B 45/18* (2020.01)
*H05B 45/20* (2020.01)
*F21Y 113/10* (2016.01)
*F21Y 115/10* (2016.01)

(52) U.S. Cl.
CPC ...... *H05B 45/3577* (2020.01); *F21Y 2113/10* (2016.08); *F21Y 2115/10* (2016.08)

(56) References Cited

U.S. PATENT DOCUMENTS

| | | | |
|---|---|---|---|
| 2012/0014111 A1* | 1/2012 | Welten | F21V 3/00 362/296.08 |
| 2013/0265796 A1* | 10/2013 | Kwisthout | G02B 6/001 362/555 |
| 2014/0268779 A1 | 9/2014 | Sorensen et al. | |
| 2014/0355292 A1* | 12/2014 | Krause | G02B 6/001 362/555 |
| 2018/0031218 A1 | 2/2018 | Knapp et al. | |

\* cited by examiner

LED FILAMENT LAMP COMPRISING A CONTROL UNIT

CROSS-REFERENCE TO PRIOR APPLICATIONS

This application is the U.S. National Phase application under 35 U.S.C. § 371 of International Application No. PCT/EP2019/054046, filed on Feb. 19, 2019, which claims the benefit of European Patent Application No. 18158870.8, filed on Feb. 27, 2018. These applications are hereby incorporated by reference herein.

FIELD OF THE INVENTION

The present invention generally relates to lighting arrangements comprising one or more light emitting diodes. More specifically, the lighting arrangement is related to a light emitting diode (LED) filament lamp comprising a control unit for controlling the intensity and the color temperature of the light from the LED filament lamp.

BACKGROUND OF THE INVENTION

The use of light emitting diodes (LED) for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

Due to the advantageous aspects of the use of LEDs, the interest has rapidly increased to replace conventional light sources with LEDs in many lighting arrangements. It will be appreciated that this replacement, also called retrofitting, is appreciated and desired by users who wish to have the look of an incandescent bulb. The light source replacement (retrofitting) is often performed by removing the conventional light source(s) from the luminaire (e.g. a lamp holder) of the lighting arrangement and attaching the LEDs, LED arrangement(s) or LED device(s) into the luminaire. One of these concepts is based on LED filaments which are placed in a bulb, as the appearance of lamps of this kind are appreciated as they are highly decorative.

It should be noted, however, that current LED filament lamps are not color controllable. LED filaments emitting different color temperatures may be used, but it is usually not appreciated or desired to see LED filaments emitting different color temperatures.

Hence, alternative solutions are of interest, such that a color controllable lighting arrangement may be provided while the lighting arrangement still possesses the desired, aesthetic properties during operation.

U.S. Pat. No. 9,420,644 discloses an apparatus and associated methods that relate to a diversion driver module that dynamically adds a diversion current to an LED current so that the summed current maintains a predetermined minimum holding current requirement of a phase-controlled dimmer supply.

SUMMARY OF THE INVENTION

It is an object of the present invention to mitigate at least some of the above problems and to provide a lighting arrangement which is able to provide a control of the color temperature of the light emitted from the lighting arrangement during operation, while the lighting arrangement still possesses the desired, aesthetic properties.

This and other objects are achieved by providing a light emitting diode filament lamp having the features in the independent claim. Preferred embodiments are defined in the dependent claims.

Hence, according to the present invention, there is provided a light emitting diode (LED) filament lamp. The LED filament lamp comprises at least one light emitting diode light source comprising at least one first filament, arranged to emit light having a first color temperature, and at least one second filament, arranged to emit light having a second color temperature, different from the first color temperature. Each of the at least one first filament and the at least one second filament comprises a substrate of elongated shape, wherein at least one light emitting diode is arranged on the substrate. The LED filament lamp further comprises a control unit configured to control a first intensity of the light emitted from the at least one first filament and to control a second intensity of the light emitted from the at least one second filament according to at least one predetermined setting, in order to control the total color temperature of the light emitted from the LED filament lamp as a function of the at least one predetermined setting.

Thus, the present invention is based on the idea of providing a LED filament lamp in which the control unit is configured to control the respective intensities of the light emitted from the first filament(s) and the second filament(s) of a LED light source of the LED filament lamp according to one or more predetermined settings. The control unit may hereby efficiently and conveniently control the total color temperature of the light emitted from the LED filament lamp.

The control unit of the LED filament lamp may for example control the intensities of the light emitted from the first and second filaments to an extent that glare is achieved by the total light emitted from the LED filament lamp. The advantage hereof is that a person may not able to distinguish that the first and second filaments are emitting light of different color temperatures, which is an aesthetically desirable effect.

The present invention is further advantageous in that the intensities of the light emitted from the filaments of the LED filament lamp may be controlled according to one or more predetermined settings, resulting in a versatile manner of controlling the color of the light emitted from the LED filament lamp.

A further advantage of the present invention is that the control unit for controlling the intensities of the light emitted from the filaments is comprised in the LED filament lamp, resulting in a relatively compact color-controllable LED filament lamp.

It will be appreciated that the LED filament lamp of the present invention furthermore comprises relatively few components. The low number of components is advantageous in that the LED filament lamp is relatively inexpensive to fabricate. Moreover, the low number of components of the LED filament lamp implies an easier recycling, especially compared to devices or arrangements comprising a relatively high number of components which impede an easy disassembling and/or recycling operation.

The LED filament lamp comprises at least one LED light source. The LED light source, in its turn, comprises at least one first filament, arranged to emit light having a first color temperature, and at least one second filament, arranged to emit light having a second color temperature, wherein the second color temperature is different from the first color temperature. Hence, the first color temperature may be defined in a first range which is separate, or partially overlapping, with a second range of the second color temperature.

Each of the at least one first filament and the at least one second filament comprises a substrate of elongated shape, wherein at least one LED is arranged on the substrate. Hence, one or more LEDs are arranged, mounted and/or mechanically coupled on/to the substrate which is configured to support the LEDs.

The LED filament lamp further comprises a control unit. By "control unit" it is hereby meant a device, arrangement, element, or the like, which is configured to control first and second intensities of the light emitted from the first and the second filament(s), respectively. The control of the control unit is performed according to one or more predetermined settings. By the term "predetermined setting", it is hereby meant a setting, setup, program, relationship, or the like, which is set or determined in advance. The control unit may hereby control the total color temperature of the light emitted from the LED filament lamp as a function of this or these predetermined setting(s).

According to an embodiment of the present invention, the control unit may be configured to control a switching of the at least one second filament as a function of the first intensity of the light emitted from the at least one first filament. Hence, the control unit may be configured to switch on or off the second filament(s) as a function of the first intensity of the light emitted from the at least one first filament. For example, and according to an embodiment of the present invention, the control unit may be configured to increase the first intensity of the light emitted from the at least one first filament to a predetermined threshold, and subsequently, switch on the at least one second filament and increase the second intensity of the light emitted from the at least one second filament. It will be appreciated that the reverse operation is also feasible, namely that the control unit may be configured to decrease the second intensity of the light emitted from the second filament(s), and switch off the second filament(s) when the first intensity of light emitted from the first filament(s) is at, or above, the predetermined threshold. The embodiment is advantageous in that the transition from the off-state of the second filament to the on-state of the second filament (or vice versa) may not be visible to an observer, as the first intensity of the light emitted from the first filament(s) has attained a predetermined threshold.

According to an embodiment of the present invention, the control unit may be configured to control the first intensity of the light emitted from the at least one first filament between any of a first low level, $L_{10}$, a first medium level, $L_{11}$, and a first high level, $L_{12}$, wherein $L_{10}<L_{11}<L_{12}$, and to control the second intensity of the light emitted from the at least one second filament between any of a second low level, $L_{20}$, a second medium level, $L_{21}$, and a second high level, $L_{22}$, wherein $L_{20}<L_{21}<L_{22}$. It will be appreciated that the terms "low", "medium", and "high" may be interpreted in a relative way, i.e. that the (first or second) low level is lower than the (first or second) medium level, which in turn is lower than the (first or second) high level. It will be appreciated that the "high level" is not a fixed level, but represents the highest occurring level in a specific predetermined or preprogrammed level sequence.

Furthermore, in order to explain the operation of the control unit, the control unit may be configured to control the first and second intensities of the light emitted from the first and second filaments according to a predetermined setting between the first and second low levels, the first and second medium levels, and the first and second high levels, respectively. For example, the control unit may be configured to control the first intensity of the light emitted from the first filament(s) from the first low level to the first medium level (or reversed), or from the first low level to the first high level (or reversed). It will be appreciated that the previously mentioned examples of the control of the first intensity of the emitted light is also applicable to the control of the second intensity of the emitted light. The present embodiment is advantageous in that the low, medium and high levels of the first and second intensities of the emitted light may constitute predetermined levels of the one or more predetermined settings of the control unit, for an even more convenient control of the LED filament lamp.

According to an embodiment of the present invention, the control unit may be configured to increase the first intensity of the light emitted from the at least one first filament from the first low level to the first high level. Subsequently, the control unit may be configured to simultaneously increase the second intensity of the at least one second filament from the second low level to the second high level and decrease the first intensity of the at least one first filament from the first high level to the first low level. Hence, according to this (first) predetermined setting, the control unit may first be configured to increase the first intensity of the light emitted from the first filament(s) from the first low level to the first high level, while the second intensity of the light emitted from the second filament(s) is maintained at the second low level. Then, the control unit may, at the same time, increase the second intensity of the light emitted from the second filament(s) from the second low level to the second high level and decrease the first intensity of the light emitted from the first filament(s) from the first high level to the first low level. As a consequence, the control unit is configured to control the total color temperature of the light emitted from the LED filament lamp as a function of this (first) predetermined setting. During the increase of the first intensity of the light emitted from the first filament(s) from the low level to the high level, the total intensity of the light emitted from the LED filament lamp increases from a low level of the total intensity to a high level of the total intensity, whereas the total color temperature of the light emitted from the LED filament lamp remains substantially constant at a low level. Subsequently, as a result of the simultaneous increase of the second intensity of the light emitted from the second filament(s) from the second low level to the second high level and the decrease of the first intensity of the light emitted from the first filament(s) from the first high level to the first low level, the total color temperature of the light emitted from the LED filament lamp increases from the low level to a high level of the total color temperature, whereas the total intensity of the light emitted from the LED filament lamp remains substantially constant at the high level of the total intensity.

According to an embodiment of the present invention, which furthermore constitutes a reverse operation of the previous embodiment, the control unit may be configured to simultaneously decrease the second intensity of the light emitted from the at least one second filament from the second high level to the second low level and increase the first intensity of the light emitted from the at least one first filament from the first low level to the first high level. The control unit may be configured to subsequently decrease the first intensity of the light emitted from the at least one first filament from the first high level to the first low level.

According to an embodiment of the present invention, the control unit may be configured to increase the first intensity of the light emitted from the at least one first filament from the first low level to the first medium level. Subsequently, the control unit may be configured to simultaneously increase the first intensity of the light emitted from the at least one first filament from the first medium level to the first high level, and increase the second intensity of the light emitted from the at least one second filament from the second low level to the second high level. Hence, according to this (second) predetermined setting, the control unit may first be configured to increase the first intensity of the light emitted from the first filament(s) from the first low level to the first medium level, while the second intensity of the second filament(s) is maintained at the second low level. Then, the control unit may, at the same time, increase the first intensity of the light emitted from the first filament(s) from the first medium level to the first high level, and increase the second intensity of the light emitted from the second filament(s) from the second low level to the second high level. As a consequence, the control unit is configured to control the total color temperature of the light emitted from the LED filament lamp as a function of this (second) predetermined setting. During the increase of the first intensity of the light emitted from the first filament(s) from the low level to the medium level, the total intensity of the light emitted from the LED filament lamp increases from a low level to a medium level of the total intensity, whereas the total color temperature of the light emitted from the LED filament lamp remains substantially constant at a low level. Subsequently, as a result of the simultaneous increases of the first and second intensities of the light emitted from the first and second filaments, respectively, the total color temperature of the light emitted from the LED filament lamp increases from the low level to a high level of the total color temperature.

According to an embodiment of the present invention, which furthermore constitutes a reverse operation of the previous embodiment, the control unit may further be configured to simultaneously decrease the first intensity of the light emitted from the at least one first filament from the first high level to the first medium level, and decrease the second intensity of the light emitted from the at least one second filament from the second high level to the second low level. Subsequently, the control unit may be configured to decrease the first intensity of the light emitted from the at least one first filament from the first medium level to the first low level.

According to an embodiment of the present invention, the control unit may further be configured to increase the first intensity of the light emitted from the at least one first filament from the first low level to a level in a range between the first medium level and the first high level, and subsequently increase the second intensity of the light emitted from the at least one second filament from the second low level to a level in a range between the second medium level and the second high level. Hence, according to this (third) predetermined setting, the control unit may first be configured to increase the first intensity of the light emitted from the first filament(s) from the first low level to a level in a range between the first medium level and the first high level, while the second intensity of the light emitted from the second filament(s) is maintained at the second low level. Then, the control unit may increase the second intensity of the light emitted from the second filament(s) from the second low level to a level in a range between the second medium level and the second high level while maintaining the first intensity of the light emitted from the first filament(s) at the level in the range between the first medium level and the first high level. As a consequence, the control unit is configured to control the total color temperature of the light emitted from the LED filament lamp as a function of this (third) predetermined setting. During the increase of the first intensity of the light emitted from the first filament(s) from the low level to the level in the range between the medium level and the high level, the total intensity of the light emitted from the LED filament lamp increases from a low level to a medium level of the total intensity, whereas the total color temperature of the light emitted from the LED filament lamp remains substantially constant at a low level. Subsequently, as a result of the increase of the second intensity of the light emitted from the second filament(s), the total color temperature of the light emitted from the LED filament lamp increases gradually from the low level of the total color temperature, but at a somewhat lower rate compared to the second setting as previously described.

According to an embodiment of the present invention, which furthermore constitutes a reverse operation of the previous embodiment, the control unit may further be configured to decrease the second intensity of the light emitted from the at least one second filament from a level in a range between the second medium level and the second high level to the second low level. The control unit may further be configured to subsequently decrease the first intensity of the light emitted from the at least one first filament from a level in a range between the first medium level and the first high level to the first low level.

According to an embodiment of the present invention, the control unit may further be configured to increase the first intensity of the light emitted from the at least one first filament from the first low level to a level in the range between the first medium level and the first high level. Subsequently, the control unit may simultaneously maintain the first intensity of the light emitted from the at least one first filament at the level in the range between the first medium level and the first high level, and increase the second intensity of the light emitted from the at least one second filament from the second low level to the second medium level. Subsequently, the control unit may simultaneously decrease the first intensity of the light emitted from the at least one first filament from the level in the range between the first medium level and the first high level to the first low level, and increase the second intensity of the light emitted from the at least one second filament from the second medium level to a level in a range between the second medium level and the second high level. Consequently, the control unit is configured to control the total color temperature of the light emitted from the LED filament lamp as a function of this (fourth) predetermined setting. During the increase of the first intensity of the light emitted from the first filament(s) from the first low level to the level in the range between the first medium level and the first high level, the total intensity of the light emitted from the LED filament lamp increases from a low level of the total intensity to a medium level of the total intensity, whereas the total color temperature of the light emitted from the LED filament lamp remains substantially constant at a low level. Subsequently, as a result of the increase of the second intensity of the light emitted from the second filament(s) from second low level to the second medium level, the total color temperature of the light emitted from the LED filament lamp increases gradually from the low level to the medium level of the total color temperature. Thereafter, following the decrease of the first intensity of the light emitted from the first filament(s) from the level in the range between the first medium level and the first high level to the first low level, and the increase of the second intensity of the light emitted from the second filament(s) from the second medium level to the level in the range between the second medium level and the second high level, the total color temperature of the light emitted from the LED filament lamp increases sharply.

According to an embodiment of the present invention, which furthermore constitutes a reverse operation of the previous embodiment, the control unit may further be configured to simultaneously increase the first intensity of the light emitted from the at least one first filament from the first low level to a level in the range between the first medium level and the first high level, and decrease the second intensity of the light emitted from the at least one second filament from a level in the range between the second medium level and the second high level to the second medium level. The control unit may subsequently be configured to simultaneously maintain the first intensity of the light emitted from the at least one first filament at the level in the range between the first medium level and the first high level and decrease the second intensity of the light emitted from the at least one second filament from the second medium level to the second low level. Subsequently, the control unit may decrease the first intensity of the light emitted from the at least one first filament from the level in the range between the first medium level and the first high level to the first low level.

According to an embodiment of the present invention, the first range of the color temperature of the light emitted from the at least one first filament may be 2000 K to 2600 K, and the second range of the color temperature of the light emitted from the at least one second filament may be 2700 K to 3500 K. The present embodiment is advantageous in that the total color temperature of the light emitted from the LED filament lamp may be varied from a relatively low level, such as 2000 K to 2600 K, to a relatively high level, such as 2700 K to 3500 K. Furthermore, the difference in color temperature between the light emitted from the first and second filaments is at least 400 K, more preferably at least 500 K, most preferably at least 600 K.

According to an embodiment of the present invention, the control unit may be configured to control a switching of the at least one second filament as a function of the luminous flux of the light emitted from the at least one first filament. For example, the control unit may be configured to switch on the at least one first filament, and subsequently switch on the at least one second filament as a function of the luminous flux of the light emitted from the at least one first filament. For example, the control unit may be configured to switch on the at least one second filament when the light emitted from the first filament(s) provides a luminous flux of 30-70%, preferably 40-65%, and most preferred 55-60% of its maximum luminous flux. Analogously, the control unit may further be configured to switch off the at least one second filament as a function of the luminous flux of the light emitted from the at least one first filament, and subsequently switch off the at least one first filament.

According to an embodiment of the present invention, the range of the total luminous flux of the light emitted from the LED filament lamp may be 250 lm to 400 lm, preferably 270 lm to 370 lm, and most preferred 290 to 350 lm. It will be appreciated that the mentioned range(s) of the luminous flux may correspond to the predetermined threshold of the first intensity of the light emitted from the at least one first filament according to one or more embodiments. For example, the control unit may be configured to switch on the second filament(s) of the LED light source when the first intensity of the light emitted from the first filament(s) (i.e. the total intensity of the emitted light in this case) has attained this range.

According to an embodiment of the present invention, at least one of the at least one first filament and at least one of the at least one second filament may be arranged as at least one pair of adjacently arranged filaments extending along a longitudinal axis, A, of the LED filament lamp, wherein the filaments of the pair are separated by an average distance, $D_1$, along an axis, B, perpendicular to the longitudinal axis. Hence, a pair of filaments consisting of a first filament and a second filament extends along a longitudinal axis, A, of the LED filament lamp, wherein the filaments of the pair are separated by an average distance, $D_1$. The present embodiment is advantageous in that the separated filaments of the pair may be visible at a relatively low intensity or an off-state of the LED filament lamp.

According to an embodiment of the present invention, the control unit may be configured to control the first intensity of the light emitted from the at least one first filament and to control the intensity of the light emitted from the at least one second filament as a function of the average distance, $D_1$. The present embodiment is advantageous in that the control unit in a convenient and efficient manner may control the visibility of the first and second filaments of the pair of filaments during operation of the LED filament lamp. For example, in case the average distance between the first and second filaments of the pair of filaments is relatively large, the control unit may be configured to set a relatively high total intensity of the light emitted from the first and second filaments during operation of the LED filament lamp, such that the individual filaments are not visible by a person.

According to an embodiment of the present invention, at least one of a phosphor concentration, a thickness, and the type of the at least one light emitting diode of the at least one first filament differs from the respective one of a phosphor concentration, a thickness, and the type of the at least one light emitting diode of the at least one second filament. Hence, the first filament(s) and the second filament(s) may differ in phosphor concentration, thickness and/or and the type of the light emitting diode(s) which is (are) arranged on the substrate of the filament. As a result, the first filament(s) and the second filament(s) may be configured to emit light having different color temperatures, but still have similar, or virtually the same, physical appearances. The present embodiment is advantageous in that a person may not be able to notice any difference between the first filament(s) and the second filament(s) in an off-state of the LED filament lamp, which is aesthetically desirable.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
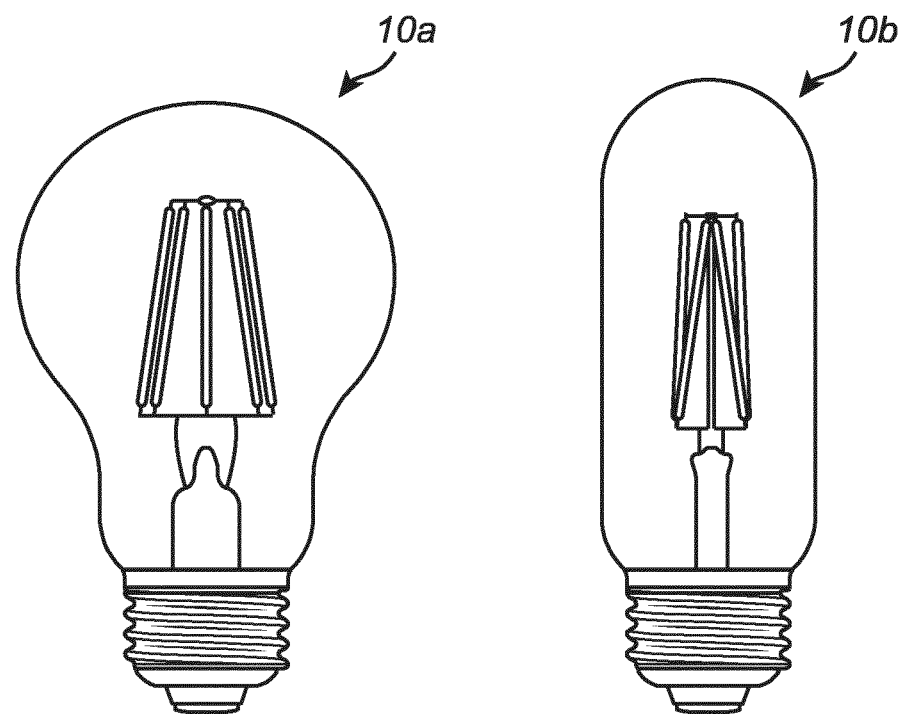
FIG. 1 shows examples of retrofit lamps according to the prior art.

Incandescent lamps are rapidly being replaced by LED based lighting solutions. It is nevertheless appreciated and desired to have retrofit lamps which have the features (e.g. the look) of an incandescent bulb. For this purpose, it is possible to produce incandescent lamps and replace the filaments with LEDs emitting white light. The appearance of the lamps of this kind, of which lamps 10a,b are presented as examples in FIG. 1, is highly appreciated. However, it should be noted that the current LED filament lamps are not color controllable. LED filaments emitting different color temperatures may be used, but it is usually not appreciated or desired to see LED filaments emitting different color temperatures. Hence, alternative solutions are of interest, such that a color controllable lighting arrangement may be provided while the lighting arrangement still possesses desired, aesthetic properties during operation.

Figures 2A, 2B:
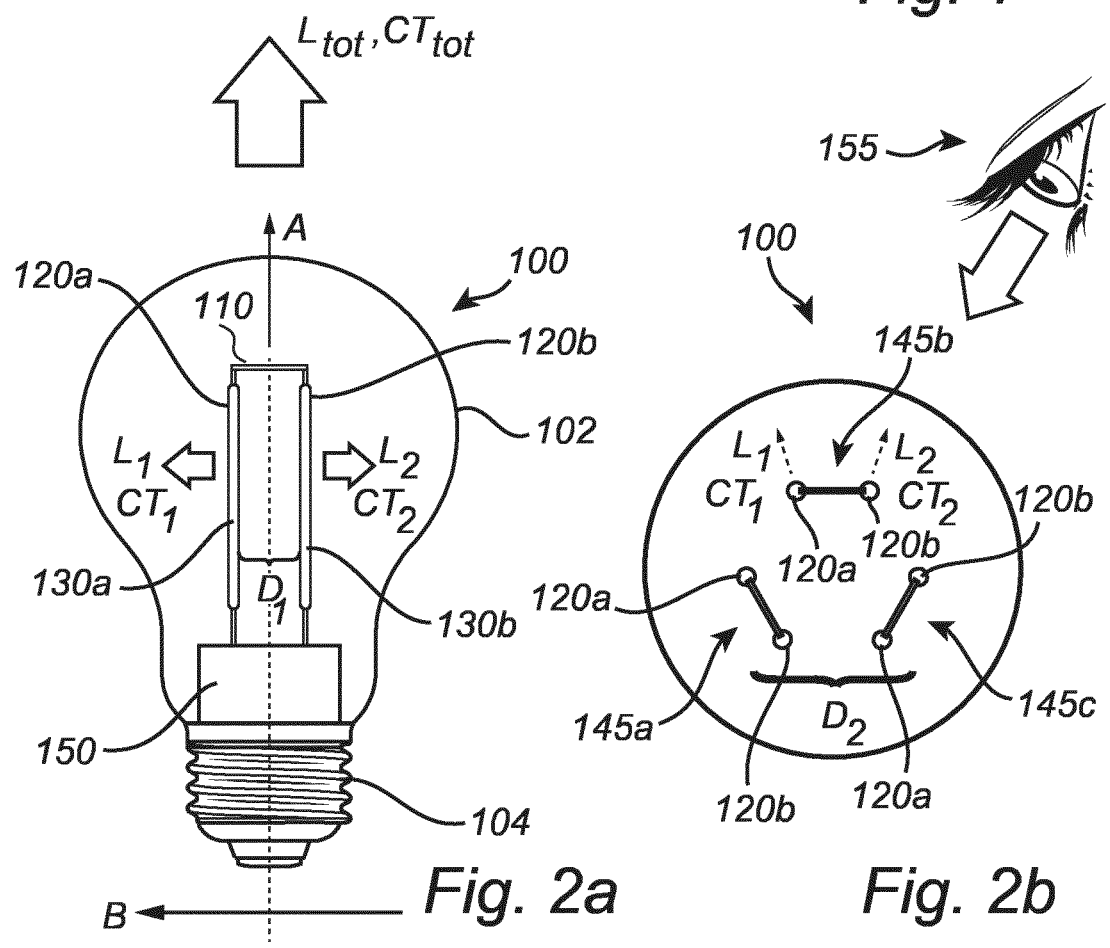
FIGS. 2a,b show a light emitting diode, LED, filament lamp according to exemplifying embodiments of the present invention, FIGS. 3a,b show examples of filaments of a LED filament lamp according to exemplifying embodiments of the present invention.

FIG. 2a shows a light emitting diode, LED, filament lamp 100 according to an exemplifying embodiment of the present invention. The LED filament lamp 100 is exemplified as a bulb-shaped lamp extending along a longitudinal axis A of the LED filament lamp 100. The LED filament lamp 100 further comprises an envelope 102, which preferably is made of glass. The LED filament lamp 100 further comprises a threaded cap 104 which is connected to the envelope 102.

The LED filament lamp 100 further comprises a LED light source 110. The LED light source 110, in its turn, comprises a first filament 120a extending along the longitudinal axis A. The first filament 120a comprises a substrate 130a of elongated shape, upon which a plurality of LEDs (not shown) are arranged. During operation of the LED filament lamp 100, the first filament 120a is arranged to emit light having a first intensity $L_1$ and first color temperature $CT_1$. The first color temperature $CT_1$ may, for example, be in the range of 2000 K to 2600 K.

The LED light source 110 of the LED filament lamp 100 further comprises a second filament 120b extending parallel to the first filament 120a and along the longitudinal axis A. The second filament 120b comprises a substrate 130b of elongated shape upon which a plurality of LEDs (not shown) are arranged. The second filament 120b is arranged to emit light having a second intensity $L_2$ and a second color temperature $CT_2$ during operation of the LED filament lamp 100. The second color temperature $CT_2$ is different from the first color temperature $CT_1$. The second color temperature $CT_2$ may, for example, be in the range of 2700 K to 3500 K.

During operation, the LED filament lamp 100 is configured to emit light having a total intensity $L_{tot}$ (i.e. $L_{tot}=L_1+L_2$) and a total color temperature $CT_{tot}$ (i.e. $CT_{tot}$ is a function of $CT_1$ and $CT_2$ depending on $L_1$ and $L_2$).

The first and second filaments 120a, 120b of the LED light source 110 are separated by an average distance $D_1$ along an axis B perpendicular to the longitudinal axis A. The average distance $D_1$ between the first and second filaments 120a, 120b may be 2 mm to 20 mm, preferably 3 mm to 17 mm, and most preferred 4 to 15 mm. The average distance $D_1$ may hereby be large enough such that the first and second filaments 120a, 120b may be individually visible by a person at a relatively low intensity or an off-state of the LED light source 110. On the other hand, the average distance $D_1$ may at the same time be small enough such that the first and second filaments 120a, 120b are not individually distinguishable at a relatively high intensity setting of the LED light source 110. The angle between the first and second filaments 120a, 120b of the LED light source 110 with respect to the longitudinal axis A is preferably less than 30°, more preferably less than 20°, even more preferred less than 10°, such as for example 0°. The mutual angle between the first and second filaments 120a, 120b may be in the range of 0-60°, preferably 0-45°, and even more preferred 10-30°.

The LED filament lamp 100 further comprises a control unit 150. In FIG. 2a, the control unit 150 is exemplified as an element being arranged between the first and second filaments 120a, 120b and the cap 104, but it should be noted that the arrangement, size, structure etc., of the control unit 150 may be different than that shown. The control unit 150 is configured to control the first intensity $L_1$ of the light emitted from the first filament(s) 120a and to control the second intensity $L_2$ of the light emitted from the second filament(s) 120b according to at least one predetermined setting. Consequently, the control unit 150 may control the total color temperature $CT_{tot}$ of the light emitted from the LED filament lamp 100 as a function of the at least one predetermined setting. It should be noted that examples of the operation of the control unit 150 according to predetermined settings are presented in FIGS. 4-7.

FIG. 2b shows a top view of the LED filament lamp 100 according to FIG. 2a, i.e. along the longitudinal axis A of the LED filament lamp 100. In this exemplifying embodiment of the LED filament lamp 100, the LED light source comprises three pairs 145a-c of first and second filaments 120a, 120b. Analogously with the embodiment of FIG. 2a, the first filaments 120a of each of the pairs 145a-c is arranged to emit light having a first intensity $L_1$ and a first color temperature $CT_1$, whereas the second filaments 120b of each of the pairs 145a-c are arranged to emit light having a second intensity $L_2$ and a second color temperature $CT_2$ (for reasons of simplicity, the emitted intensities and color temperatures are only indicated for the pair 145b of first and second filaments 120a, 120b).

Here, the pairs 145a-c are arranged along the sides of an (imaginary) equilateral triangle. However, for all embodiments it should be noted that substantially any configuration of arrangement of pairs of first and second filaments 120a, 120b may be envisaged. Although for all embodiments the LED light source may comprise substantially any number of first and second filaments 120a, 120b, it is preferred to use at least three filaments, more preferably at least four filaments, and even more preferred at least five filaments. Moreover, the number of filaments is preferably even, for example six, eight or twelve. It should be noted that in case the LED light source comprises more than two filaments, the person (stylistically indicated by an eye 155) may not be able to see that the filaments emit light of different color temperature. The distance $D_2$ between the two outermost LED filaments may preferably be 50 mm or less, more preferably <40 mm, and most preferred <35 mm.

In an embodiment, the number of first and second LED filaments need not to be equal. The ratio between the number of first LED filaments and second filaments may be in the range from 0.5 to 2. For example, the number of first LED filaments may be higher than the number of second LED filaments.

Figure 3A:
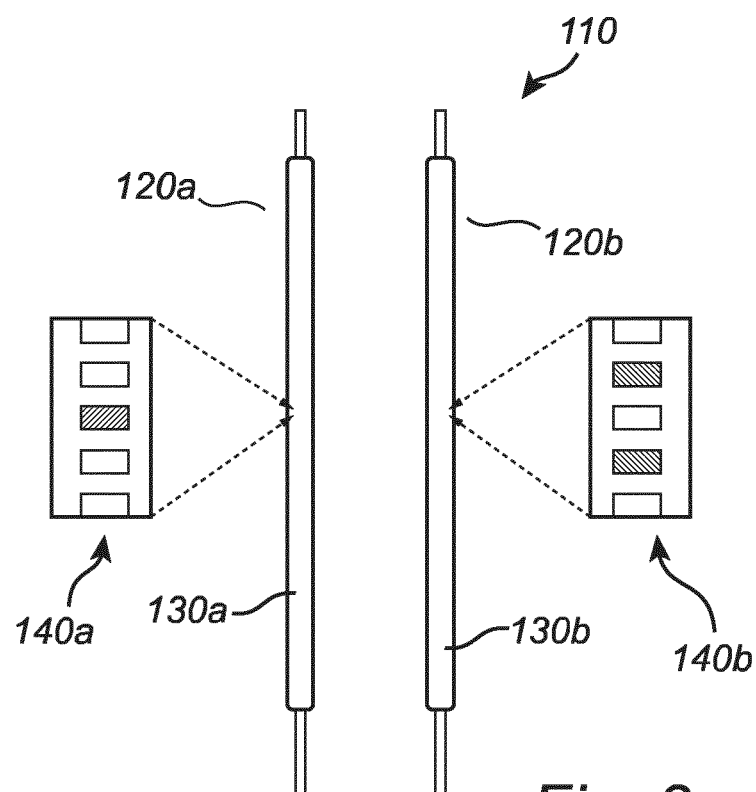

FIG. 3a shows an example of first and second filaments 120a, 120b of a LED light source 110 comprised in a LED filament lamp according to an exemplifying embodiment of the present invention. The first and second filaments 120a, 120b differ from each other in that the LEDs 140a arranged on the substrate 130a of the first filament 120a are of a different type than the LEDs 140b arranged on the substrate 130b of the second filament 120b. This is stylistically shown in FIG. 3a by the enlargement of the respective substrate 130a, 130b, indicating the LEDs 140a, 140b. As a result, the light emitted from the first filament 120a differs from the light emitted from the second filament 120b during operation of the LED filament lamp, whereas at the off-state of the LED filament lamp, the first and second filaments 120a, 120b appear to have similar, or virtually the same, physical appearances.

Figure 3B:
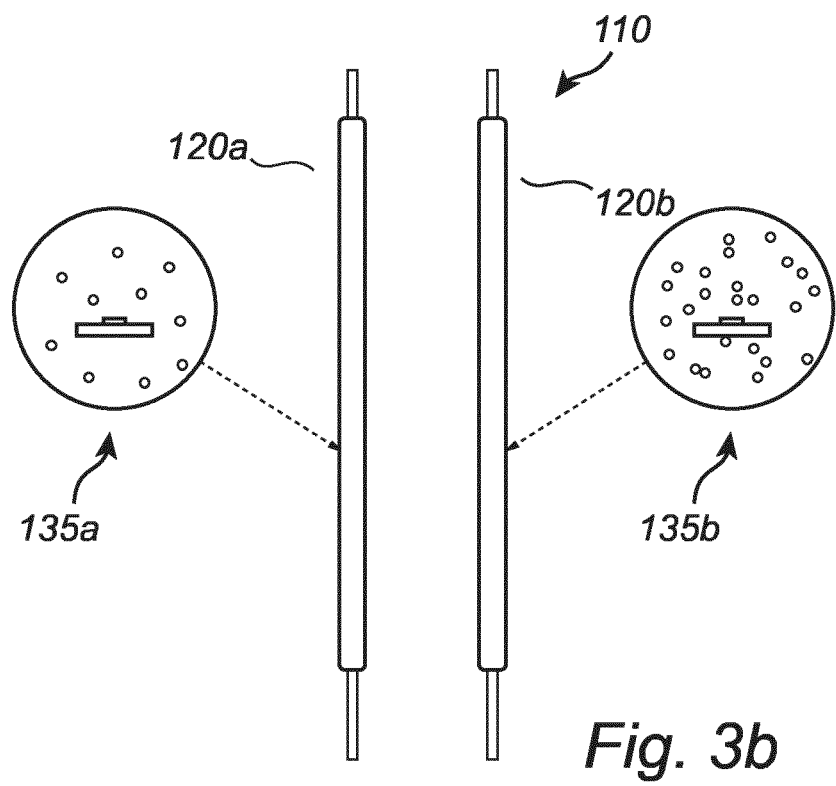

FIG. 3b shows an example of first and second filaments 120a, 120b of LED light source 110 comprised in a LED filament lamp according to an exemplifying embodiment of the present invention. Here, the first and second filaments 120a, 120b differ in their respective phosphor concentration and/or thickness. For example, the phosphor concentration 135b of the second filament 120b is larger than the phosphor concentration 135a of the first filament 120a. As a consequence, the first and second filaments 120a, 120b appear to have similar, or virtually the same, physical appearances at the off-state of the LED filament lamp, whereas the light emitted from the first filament 120a differs from the light emitted from the second filament 120b during operation of the LED filament lamp.

Common to the embodiments as described in FIGS. 3a-b is that the LEDs 140a, 140b are typically embedded in a coating on the respective substrate 130a, 130b. Furthermore, the coatings might comprise a phosphor, and the coating of the substrate 130a might vary in thickness compared to the coating of the substrate 130b.

FIGS. 4-7 show examples of predetermined settings of a control unit of a LED filament lamp according to exemplifying embodiments of the present invention. For example, the control unit may, by one or more of the following predetermined settings, control the intensities of the light emitted from the first and second filaments of the LED light source of the LED filament lamp in order to control the total color temperature of the light emitted from the LED filament lamp. Common to all embodiments of FIGS. 4-7 is that the control unit may be configured to control the first intensity $L_1$ of the light emitted from the first filament of the LED light source between any of a first low level, $L_{10}$, a first medium level, $L_{11}$, and a first high level, $L_{12}$, wherein $L_{10} < L_{11} < L_{12}$. Analogously, the control unit may be configured to control the second intensity $L_2$ of the light emitted from the second filament(s) of the LED light source between any of a second low level, $L_{20}$, a second medium level, $L_{21}$, and a second high level, $L_{22}$, wherein $L_{20} < L_{21} < L_{22}$. It will be appreciated that the first low level $L_{10}$ and/or the second low level $L_{20}$ may, for example, be zero. In other words, the first filament(s) and/or the second filament(s) of the LED light source may be turned off.

It will be appreciated that the exemplifying embodiments of FIG. 4-7 respectively describes an increase in the total color temperature by an increase of the total intensity $L_{tot}$ of the light emitted from the LED light source of the LED filament lamp. However, it is understood that the reverse operation is feasible, i.e. a decrease in the total color temperature by a decrease of the total intensity of the light emitted from the LED light source of the LED filament lamp (i.e. dimming). However, for reasons of simplicity, only the predetermined settings of an increasing total intensity are shown in FIGS. 4-7.

Figure 4A:
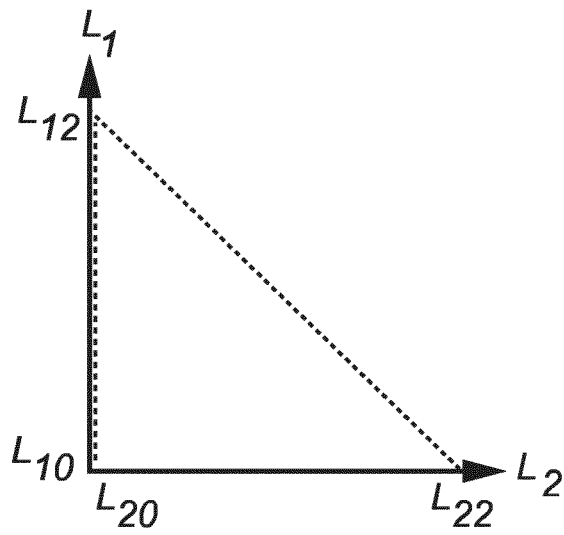
FIGS. 4-7 show examples of predetermined settings of a control unit of a LED filament lamp according to exemplifying embodiments of the present invention.

FIG. 4a shows an embodiment of a predetermined setting, in which the control unit is configured to increase the first intensity $L_1$ of the light emitted from the first filament(s) from the first low level $L_{10}$ to the first high level $L_{12}$, i.e. along the y axis of the first intensity $L_1$. Subsequently, the control unit is configured to simultaneously increase the second intensity $L_2$ of the at least one second filament from the second low level $L_{20}$ to the second high level $L_{22}$ and decrease the first intensity of the at least one first filament from the first high level $L_{12}$ to the first low level $L_{10}$. Consequently, the control unit is configured to control the total color temperature $CT_{tot}$ of the light emitted from the LED filament lamp as a function of this predetermined setting.

Figure 4B:
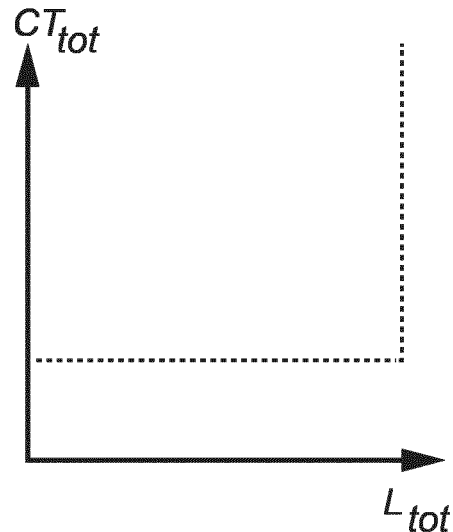

FIG. 4b shows the effect of the operation of the control unit according to FIG. 4a, in terms of total intensity $L_{tot}$ and total color temperature $CT_{tot}$ of the light emitted from the LED filament lamp. During the increase of the first intensity $L_1$ of the light emitted from the first filament(s) from the low level $L_{10}$ to the high level $L_{12}$, the total intensity $L_{tot}$ of the light emitted from the LED filament lamp increases from a low level of the total intensity $L_{tot}$ to a high level of the total intensity $L_{tot}$, whereas the total color temperature $CT_{tot}$ of the light emitted from the LED filament lamp remains substantially constant at a low level. Subsequently, as a result of the simultaneous increase of the second intensity $L_2$ of the light emitted from the second filament(s) from the second low level $L_{20}$ to the second high level $L_{22}$ and the decrease of the first intensity $L_1$ of the light emitted from the first filament(s) from the first high level $L_{12}$ to the first low level $L_{10}$, the total color temperature $CT_{tot}$ of the light emitted from the LED filament lamp increases from the low level to a high level, whereas the total intensity $L_{tot}$ of the light emitted from the LED filament lamp remains substantially constant at a high level. Hence, there is a sharp increase in the total color temperature $CT_{tot}$ as a function of the total intensity $L_{tot}$ at the high level of the total intensity $L_{tot}$.

Figure 5A:
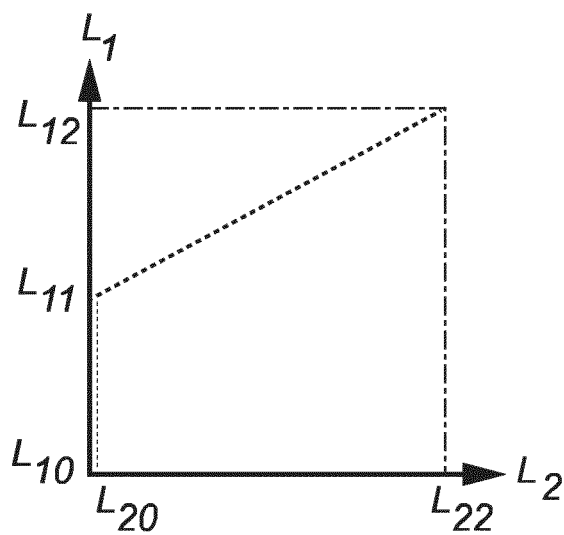

FIG. 5a shows another embodiment of a predetermined setting, in which the control unit is configured to increase the first intensity $L_1$ of the light emitted from the at least one first filament from the first low level $L_{10}$ to the first medium level $L_{11}$, while maintaining the second intensity $L_2$ of the light emitted from the at least one second filament at the low level $L_{20}$. Subsequently, the control unit may be configured to simultaneously increase the first intensity $L_1$ of the light emitted from the at least one first filament from the first medium level $L_{11}$ to the first high level $L_{12}$, and increase the second intensity $L_2$ of the light emitted from the at least one second filament from the second low level $L_{20}$ to the second high level $L_{22}$.

Figure 5B:
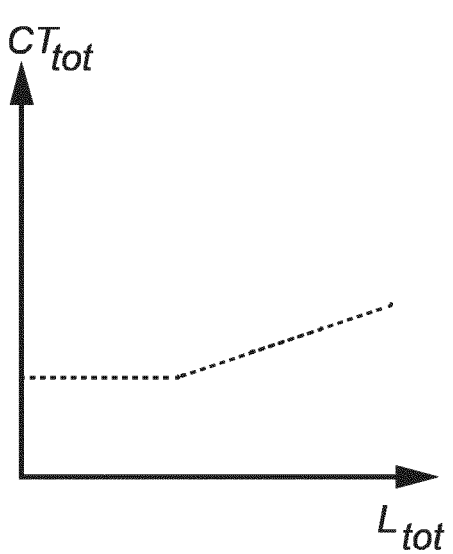

FIG. 5b shows the effect of the operation of the control unit according to FIG. 5a, in terms of total intensity $L_{tot}$ and total color temperature $CT_{tot}$ of the light emitted from the LED filament lamp. During the increase of the first intensity $L_1$ of the light emitted from the first filament(s) from the low level $L_{10}$ to the medium level $L_{11}$, the total intensity $L_{tot}$ of the light emitted from the LED filament lamp increases from a low level to a medium level, whereas the total color temperature $CT_{tot}$ of the light emitted from the LED filament lamp remains substantially constant at a low level. Subsequently, as a result of the simultaneous increases of the first and second intensities $L_1$, $L_2$ of the light emitted from the first and second filaments, respectively, the total color temperature $CT_{tot}$ of the light emitted from the LED filament lamp increases from the low level to a high level of the total color temperature $CT_{tot}$. Hence, there is a gradual increase in the total color temperature $CT_{tot}$ as a function of the total intensity $L_{tot}$ at the medium level of the total intensity $L_{tot}$.

Figure 6A:
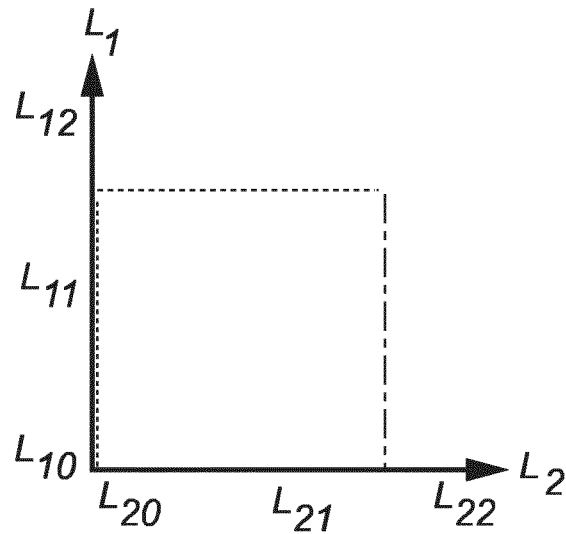

FIG. 6a shows yet another embodiment of a predetermined setting, in which the control unit is configured to increase the first intensity $L_1$ of the light emitted from the at least one first filament from the first low level $L_{10}$ to a level in a range between the first medium level $L_{11}$ and the first high level $L_{12}$, while maintaining the second intensity $L_2$ of the light emitted from the at least one second filament at the low level $L_{20}$. Subsequently, the control unit is configured to increase the second intensity $L_2$ of the light emitted from the at least one second filament from the second low level $L_{20}$ to a level in a range between the second medium level, $L_{21}$, to the second high level $L_{22}$ while maintaining the first intensity $L_1$ at the medium level $L_{11}$.

Figure 6B:
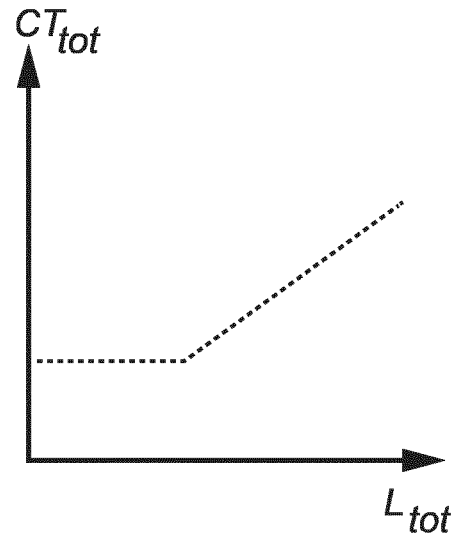

FIG. 6b shows the effect of the operation of the control unit according to FIG. 6a, in terms of total intensity $L_{tot}$ and total color temperature $CT_{tot}$ of the light emitted from the LED filament lamp. During the increase of the first intensity $L_1$ of the light emitted from the first filament(s) from the low level $L_{10}$ to a level in a range between the first medium level $L_{11}$ and the first high level $L_{12}$, the total intensity $L_{tot}$ of the light emitted from the LED filament lamp increases from a low level to a medium level of the total intensity $L_{tot}$, whereas the total color temperature $CT_{tot}$ of the light emitted from the LED filament lamp remains substantially constant at a low level. Subsequently, as a result of the increase of the second intensity $L_2$ of the light emitted from the second filament(s), the total color temperature $CT_{tot}$ of the light emitted from the LED filament lamp increases gradually from the low level of the total color temperature $C_{tot}$, and at a somewhat higher rate compared to the predetermined setting as exemplified in FIG. 5a.

Figure 7A:
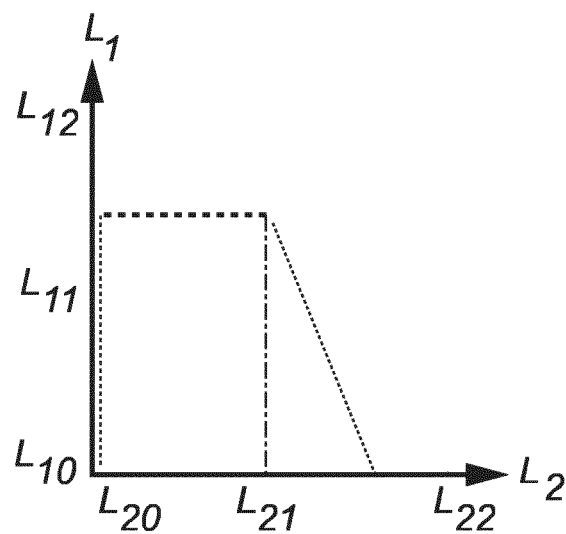

FIG. 7a shows yet another embodiment of a predetermined setting, in which the control unit may further be configured to increase the first intensity $L_1$ of the light emitted from the at least one first filament from the first low level $L_{10}$ to a level in the range between the first medium level $L_{11}$ and the first high level $L_{12}$, while maintaining the second intensity $L_2$ of the light emitted from the at least one second filament at the low level $L_{20}$. Subsequently, the control unit may simultaneously maintain the first intensity $L_1$ of the light emitted from the at least one first filament at the level in the range between the first medium level $L_{11}$ and the first high level $L_{12}$, and increase the second intensity $L_2$ of the light emitted from the at least one second filament from the second low level $L_{20}$ to the second medium level $L_{21}$. Subsequently, the control unit may simultaneously decrease the first intensity $L_1$ of the light emitted from the at least one first filament from the level in the range between the first medium level $L_{11}$ and the first high level $L_{12}$ to the first low level $L_{10}$, and increase the second intensity $L_2$ of the light emitted from the at least one second filament from the second medium level $L_{21}$ to a level in the range between the second medium level $L_{21}$ and the second high level $L_{22}$.

Figure 7B:
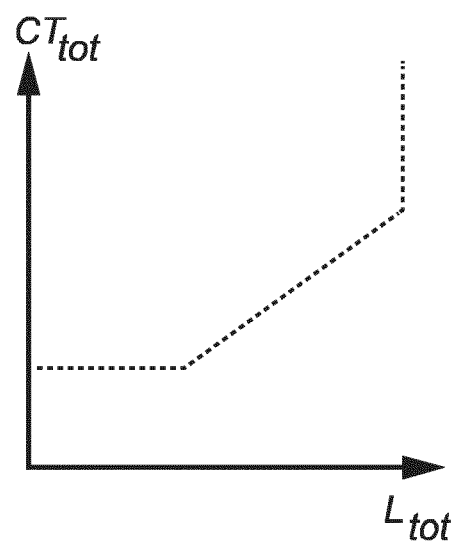

FIG. 7b shows the effect of the operation of the control unit according to FIG. 7a, in terms of total intensity $L_{tot}$ and total color temperature $CT_{tot}$ of the light emitted from the LED filament lamp. During the increase of the first intensity $L_1$ of the light emitted from the first filament(s) from the first low level $L_{10}$ to the level in the range between the first medium level $L_{11}$ and the first high level $L_{12}$, the total intensity $L_{tot}$ of the light emitted from the LED filament lamp increases from a low level to a medium level of the total intensity $L_{tot}$, whereas the total color temperature $CT_{tot}$ of the light emitted from the LED filament lamp remains substantially constant at a low level. Subsequently, as a result of the increase of the second intensity $L_2$ of the light emitted from the second filament(s) from second low level $L_{20}$ to the second medium level $L_{21}$, the total color temperature $CT_{tot}$ of the light emitted from the LED filament lamp increases gradually from the low level to the medium level of the total color temperature $CT_{tot}$. Thereafter, following the decrease of the first intensity $L_1$ of the light emitted from the first filament(s) from the level in the range between the first medium level $L_{11}$ and the first high level Liz to the first low level $L_{10}$, and the increase of the second intensity $L_2$ of the light emitted from the second filament(s) from the second medium level $L_{21}$ to the level in the range between the second medium level $L_{21}$ and the second high level $L_{22}$, the total color temperature $CT_{tot}$ of the light emitted from the LED filament lamp increases sharply.

The person skilled in the art realizes that the present invention by no means is limited to the preferred embodiments described above. On the contrary, many modifications and variations are possible within the scope of the appended claims. For example, one or more of the first and/or second filaments 120a, 120b, the control unit 150, the envelope 102, etc., may have different shapes, dimensions and/or sizes than those depicted/described. Furthermore, the control unit 150 may be configured to control the first and/or second intensities of the light emitted from first and/or second filaments, respectively, according to substantially any predetermined setting, of which FIGS. 4-7 merely show examples.

The invention claimed is:

1. A light emitting diode, LED, filament lamp, comprising
   at least one light emitting diode light source, comprising
   at least one first filament, arranged to emit light having a first color temperature, $CT_1$,
   at least one second filament, arranged to emit light having a second color temperature, $CT_2$, different from the first color temperature,
   wherein each of the at least one first filament and the at least one second filament comprises a substrate of elongated shape, wherein at least one light emitting diode is arranged on the substrate,
   a control unit configured to control a first intensity, $L_1$, of the light emitted from the at least one first filament and to control a second intensity, $L_2$, of the light emitted from the at least one second filament according to at least one predetermined setting, in order to control the total color temperature, $CT_{tot}$, of the light emitted from the LED filament lamp as a function of the at least one predetermined setting,
   said control unit being configured to control a switching of the at least one second filament as a function of the intensity of the light emitted from the at least one first filament, that is the controller increases the first intensity $L_1$ to a predetermined threshold, and subsequently, switch on the at least one second filament and increase the second intensity $L_2$, said threshold is between an intensity of 30% and 70% of its maximum intensity, or said control unit being configured to decrease the first intensity $L_2$ of the light emitted from the at least one second filament, and switch off the at least one second filament when the first intensity $L_1$ of light emitted from the at least one first filament is at, or below, the predetermined threshold.

2. The LED filament lamp according to claim 1, wherein the
threshold is preferably between 40% and 65% and most preferably between 55% and 60% of its maximum intensity.

3. The LED filament lamp according to claim 1, wherein the control unit is configured to
control the first intensity, $L_1$, of the light emitted from the at least one first filament between any of a first low level, $L_{10}$, a first medium level, $L_{11}$, and a first high level, $L_{12}$, wherein $L_{10} < L_{11} < L_{12}$, and to
control the second intensity, $L_2$, of the light emitted from the at least one second filament between any of a second low level, $L_{20}$, a second medium level, $L_{21}$, and a second high level, $L_{22}$, wherein $L_{20} < L_{21} < L_{22}$.

4. The LED filament lamp according to claim 3, wherein the control unit is configured to
increase the first intensity, $L_1$, of the light emitted from the at least one first filament from the first low level, $L_{10}$, to the first high level, $L_{12}$, and subsequently,
simultaneously increase the second intensity, $L_2$, of the light emitted from the at least one second filament from the second low level, $L_{20}$, to the second high level, $L_{22}$, and decrease the first intensity, $L_1$, of the light emitted from the at least one first filament from the first high level, $L_{12}$, to the first low level, $L_{10}$.

5. The LED filament lamp according to claim 3, wherein the control unit is configured to
simultaneously decrease the second intensity, $L_2$, of the light emitted from the at least one second filament from the second high level, $L_{22}$, to the second low level, $L_{20}$, and increase the first intensity, $L_1$, of the light emitted from the at least one first filament from the first low level, $L_{10}$, to the first high level, $L_{12}$, and subsequently,
decrease the first intensity, $L_1$, of the light emitted from the at least one first filament from the first high level, $L_{12}$, to the first low level, $L_{10}$.

6. The LED filament lamp according to claim 3, wherein the control unit is further configured to
increase the first intensity, $L_1$, of the light emitted from the at least one first filament from the first low level, $L_{10}$, to the first medium level, $L_{11}$, and subsequently,
simultaneously increase the first intensity, $L_1$, of the light emitted from the at least one first filament from the first medium level, $L_{11}$, to the first high level, $L_{12}$, and increase the second intensity, $L_2$, of the light emitted from the at least one second filament from the second low level, $L_{20}$, to the second high level, $L_{22}$.

7. The LED filament lamp according to claim 3, wherein the control unit is further configured to simultaneously decrease the first intensity, $L_1$, of the light emitted from the at least one first filament from the first high level, $L_{12}$, to the first medium level, $L_{11}$, and decrease the second intensity, $L_2$, of the light emitted from the at least one second filament from the second high level, $L_{22}$, to the second low level, $L_{20}$, and subsequently,
decrease the first intensity, $L_1$, of the light emitted from the at least one first filament from the first medium level, $L_{11}$, to the first low level, $L_{10}$.

8. The LED filament lamp according to claim 3, wherein the control unit is further configured to
increase the first intensity, $L_1$, of the light emitted from the at least one first filament from the first low level, $L_{10}$, to a level in a range between the first medium level, $L_{11}$ and the first high level $L_{12}$, and subsequently,
increase the second intensity, $L_2$, of the light emitted from the at least one second filament from the second low level, $L_{20}$, to a level in a range between the second medium level, $L_{21}$, to the second high level, $L_{22}$.

9. The LED filament lamp according to claim 3, wherein the control unit is further configured to
decrease the second intensity, $L_2$, of the light emitted from the at least one second filament from a level in a range between the second medium level, $L_{21}$, and the second high level, $L_{22}$, to the second low level, $L_{20}$, and subsequently,
decrease the first intensity, $L_1$, of the light emitted from the at least one first filament from a level in a range between the first medium level, $L_{11}$, and the first high level $L_{12}$, to the first low level, $L_{10}$.

10. The LED filament lamp according to claim 3, wherein the control unit is further configured to
increase the first intensity, $L_1$, of the light emitted from the at least one first filament from the first low level, $L_{10}$, to a level in a range between the first medium level, $L_{11}$, and the first high level, $L_{12}$, and subsequently
simultaneously maintain the first intensity, $L_1$, of the light emitted from the at least one first filament at the level in the range between the first medium level, $L_{11}$, and the first high level, $L_{12}$, and increase the second intensity, $L_2$, of the light emitted from the at least one second filament from the second low level, $L_{20}$, to the second medium level, $L_{21}$, and subsequently
simultaneously decrease the first intensity, $L_1$, of the light emitted from the at least one first filament from the level in the range between the first medium level, $L_{11}$, and the first high level, $L_{12}$, to the first low level, $L_{10}$, and increase the second intensity, $L_2$, of the light emitted from the at least one second filament from the second medium level, $L_{21}$, to a level in a range between the second medium level, $L_{21}$, and the second high level, $L_{22}$.

11. The LED filament lamp according to claim 3, wherein the control unit is further configured to
simultaneously increase the first intensity, $L_1$, of the light emitted from the at least one first filament from the first low level, $L_{10}$, to a level in a range between the first medium level, $L_{11}$, and the first high level, $L_{12}$, and decrease the second intensity, $L_2$, of the light emitted from the at least one second filament from a level in a range between the second medium level, $L_{21}$, and the second high level, $L_{22}$, to the second medium level, $L_{21}$, and subsequently,
simultaneously maintain the first intensity, $L_1$, of the light emitted from the at least one first filament at the level in the range between the first medium level, $L_{11}$, and the first high level, $L_{12}$, and decrease the second intensity, $L_2$, of the light emitted from the at least one second filament from the second medium level, $L_{21}$, to the second low level, $L_{20}$, and subsequently
decrease the first intensity, $L_1$, of the light emitted from the at least one first filament from the level in the range between the first medium level, $L_{11}$, and the first high level, $L_{12}$, to the first low level, $L_{10}$.

12. The LED filament lamp according to claim 1, wherein the first range of the color temperature of the light of the at least one first filament is 2000 K to 2600 K, and the second range of the color temperature of the light of the at least one second filament is 2700 K to 3500 K.

13. The LED filament lamp according to claim 1, wherein at least one of the at least one first filament and at least one of the at least one second filament are arranged as at least one pair of adjacently arranged filaments extending along a longitudinal axis, A, of the LED filament lamp, wherein the filaments of the pair are separated by an average distance, $D_1$, along an axis, B, perpendicular to the longitudinal axis.

14. The LED filament lamp according to claim 1, wherein at least one of a phosphor concentration, a thickness, and the type of the at least one light emitting diode of the at least one first filament differs from the respective one of a phosphor concentration, a thickness, and the type of the at least one light emitting diode of the at least one second filament.

* * * * *